(12) United States Patent
Shih et al.

(10) Patent No.: US 9,449,953 B1
(45) Date of Patent: Sep. 20, 2016

(54) PACKAGE-ON-PACKAGE ASSEMBLY AND METHOD FOR MANUFACTURING THE SAME

(71) Applicant: INOTERA MEMORIES, INC., Taoyuan (TW)

(72) Inventors: Shing-Yih Shih, New Taipei (TW); Neng-Tai Shih, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/877,949

(22) Filed: Oct. 8, 2015

(51) Int. Cl.
| H01L 23/02 | (2006.01) |
| H01L 23/28 | (2006.01) |
| H01L 25/065 | (2006.01) |
| H01L 25/10 | (2006.01) |
| H01L 23/498 | (2006.01) |

(52) U.S. Cl.
CPC ....... H01L 25/105 (2013.01); H01L 23/49811 (2013.01); *H01L 2225/1023* (2013.01); *H01L 2225/1058* (2013.01)

(58) Field of Classification Search
CPC ............ H01L 25/0657; H01L 25/117; H01L 25/043; H01L 25/0756; H01L 2224/023; H01L 2224/06167; H01L 2224/06182; H01L 2224/06187; H01L 2225/06503; H01L 2225/06562; H01L 2225/1058; H01L 2225/1041; H01L 25/03; H01L 2225/06586; H01L 2224/12105; H01L 23/3121; H01L 23/3128; H01L 2225/06527; H01L 2924/181; H01L 23/49816; H01L 23/5387; H01L 2224/32145

See application file for complete search history.

(56) References Cited

U.S. PATENT DOCUMENTS

| 8,704,354 B2* | 4/2014 | Cheng | H01L 23/3114 257/686 |
| 8,963,311 B2* | 2/2015 | Zhao | H01L 25/105 257/686 |
| 2013/0277841 A1* | 10/2013 | Lii | H01L 25/105 257/741 |

* cited by examiner

*Primary Examiner* — Jasmine Clark
(74) *Attorney, Agent, or Firm* — Winston Hsu; Scott Margo

(57) ABSTRACT

A package-on-package (PoP) assembly includes a bottom die package and a top die package mounted on the bottom die package. The bottom die package includes an interposer having a first side and a second side opposite to the first side, at least one chip mounted on the first side within a chip mounting area through a plurality of bumps, a molding compound disposed on the first side, the molding compound covering the at least one chip, and a plurality of peripheral bump structures penetrating through the molding compound within the peripheral area. Each of the peripheral bump structures includes conductive pillar and a partial TMV directly stacked on the conductive pillar. A plurality of solder balls is mounted on the second side of the interposer. The top die package is electrically connected to the peripheral bump structures.

9 Claims, 16 Drawing Sheets

PACKAGE-ON-PACKAGE ASSEMBLY AND METHOD FOR MANUFACTURING THE SAME

BACKGROUND OF THE INVENTION

1. Field of the Invention

The present disclosure relates generally to the field of semiconductor packaging, and more particularly to a Package-on-Package (PoP) assembly and a method for manufacturing the same.

2. Description of the Prior Art

With recent advancements in the semiconductor manufacturing technology microelectronic components are becoming smaller and circuitry within such components is becoming increasingly dense. To reduce the dimensions of such components, the structures by which these components are packages and assembled with circuit boards must become more compact.

In order to meet the requirements of smaller footprints with higher densities, 3D stacking packaging such as PoP (Package-on-Package) assembly has been developed. Typically, a PoP assembly includes a top package with a semiconductor die bonded to a bottom package with another device die. In PoP designs, the top package may be interconnected to the bottom package through peripheral solder balls or through mold vias (TMVs).

However, the prior art PoP assembly is not able to provide very tight pitch stacking. Further, the prior art PoP assembly has large package form factor and poor warpage control. There is a need in this industry to provide a thin and fine pitch PoP assembly with reduced form factor and manufacture method thereof.

SUMMARY OF THE INVENTION

One object of the present disclosure is to provide a semiconductor device having package-on-package (PoP) configuration.

In one aspect of the disclosure, a package-on-package (PoP) assembly includes a bottom die package and a top die package mounted on the bottom die package. The bottom die package includes an interposer having a first side and a second side opposite to the first side, at least one chip mounted on the first side within a chip mounting area through a plurality of bumps, a molding compound disposed on the first side, the molding compound covering the at least one chip, and a plurality of peripheral bump structures penetrating through the molding compound within the peripheral area. Each of the peripheral bump structures includes a conductive pillar and a partial TMV directly stacked on the conductive pillar. A plurality of solder balls is mounted on the second side of the interposer. The top die package is electrically connected to the peripheral bump structures. An undercut is present between the third conductive stud and the second conductive stud.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
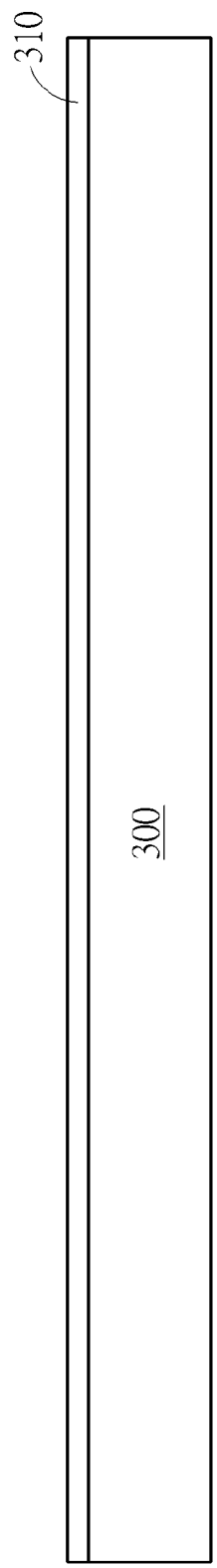
FIG. 1 to FIG. 16 are schematic, cross-sectional diagrams showing an exemplary method for fabricating a package-on-package (PoP) assembly according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

Please refer to FIG. 1 to FIG. 16. FIG. 1 to FIG. 16 are schematic, cross-sectional diagrams showing an exemplary method for fabricating a package-on-package (PoP) assembly according to one embodiment of the invention.

As shown in FIG. 1, a carrier 300 is prepared. The carrier 300 may be a releasable substrate material with an adhesive layer (not explicitly shown), but not limited thereto. At least a dielectric layer or a passivation layer 310 is then formed on a top surface of the carrier 300. The passivation layer 310 may comprise organic materials such as polyimide (PI) or inorganic materials such as silicon nitride, silicon oxide or the like.

Figure 2:
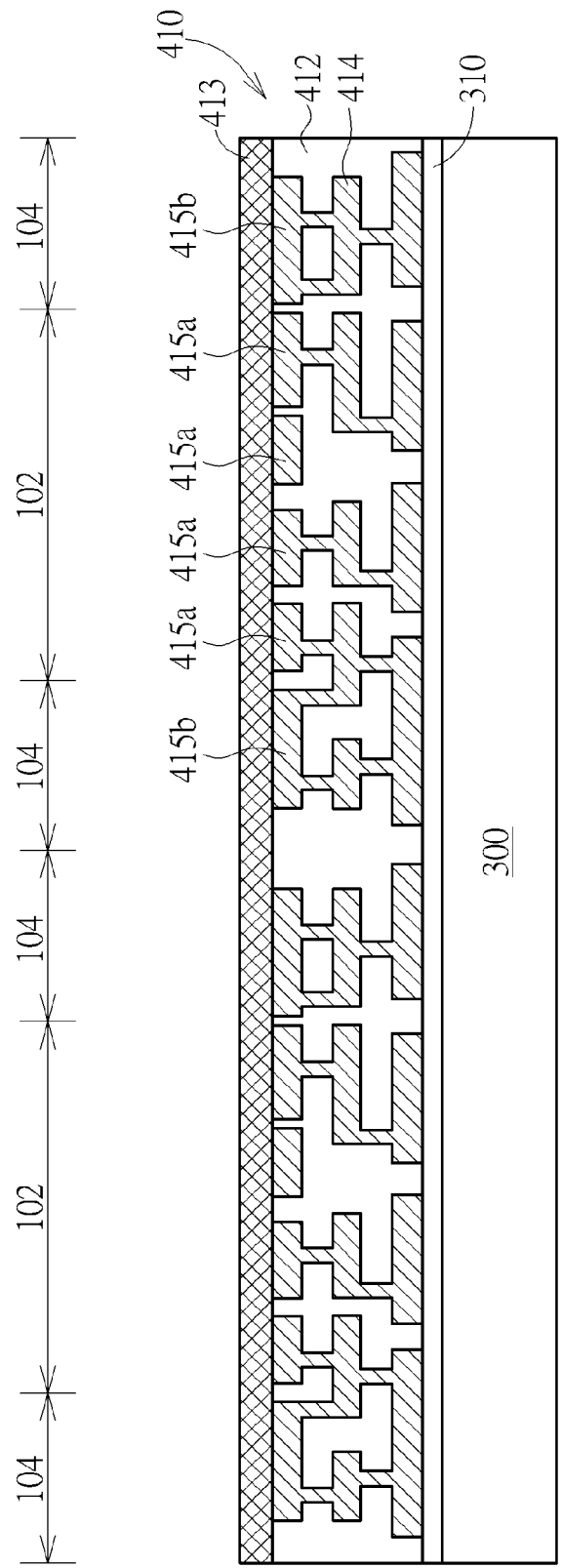

As shown in FIG. 2, subsequently, a redistribution layer (RDL) 410 is formed on the passivation layer 310. The RDL 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like.

According to the illustrated embodiment, the metal layer 414 may comprise a plurality of first bump pads 415a and second bump pads 415b exposed from a top surface of the dielectric layer 412. The first bump pads 415a are disposed within a chip mounting area 102, while the dummy pads 415b are disposed outside the chip mounting area such as a peripheral area 104 around the chip mounting area 102. Subsequently, a passivation layer 413 such as polyimide or solder mask material may be formed on the dielectric layer 412.

Figure 3:
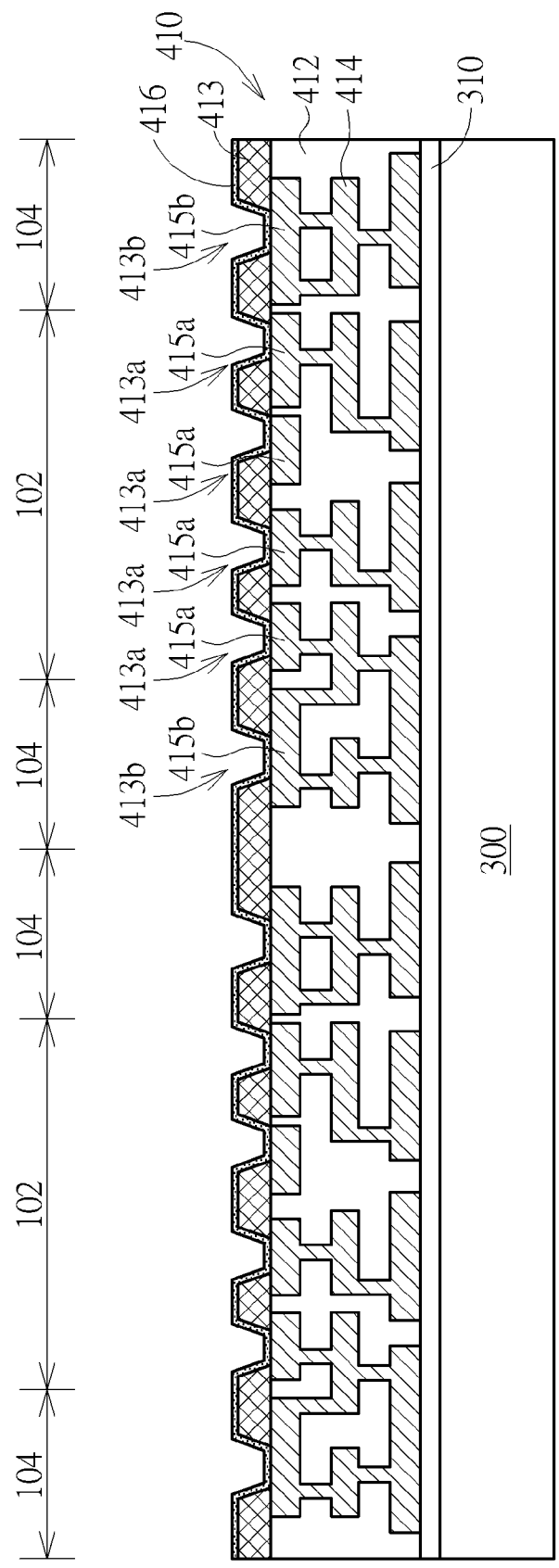

As shown in FIG. 3, a lithographic process and an etching process may be performed to form a plurality of openings 413a and 413b in the passivation layer 413. The openings 413a and 413b expose the respective first and second bump pads 415a and 415b. A conformal conductive layer 416 such as Under Bump Metallurgy (UBM) is then formed on the passivation layer 413 and in the openings 413a and 413b. For example, the conformal conductive layer 416 may comprise copper or nickel, but not limited thereto.

Figure 4:
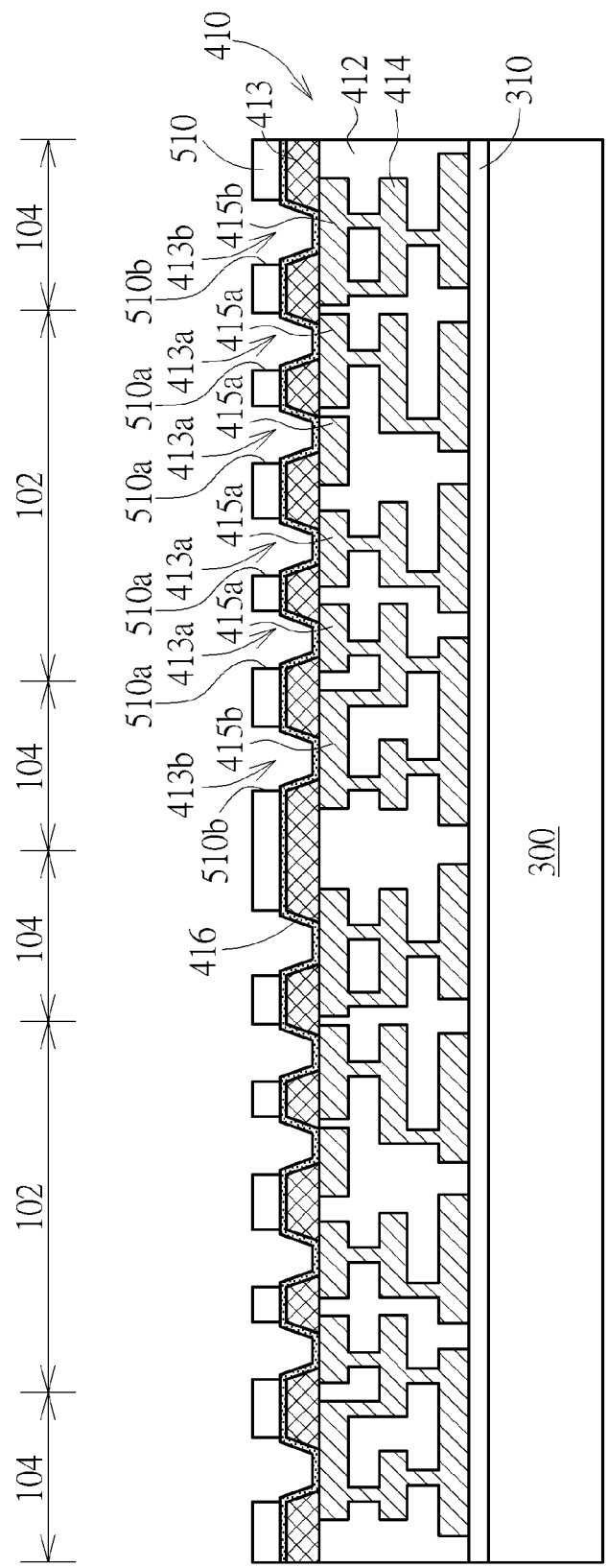

As shown in FIG. 4, a photoresist layer 510 is then coated on the conformal conductive layer 416. The photoresist layer 510 is patterned, for example, by using conventional lithographic processes, to thereby form a plurality of openings 510a and 510b directly above the openings 413a and 413b, respectively.

Figure 5:
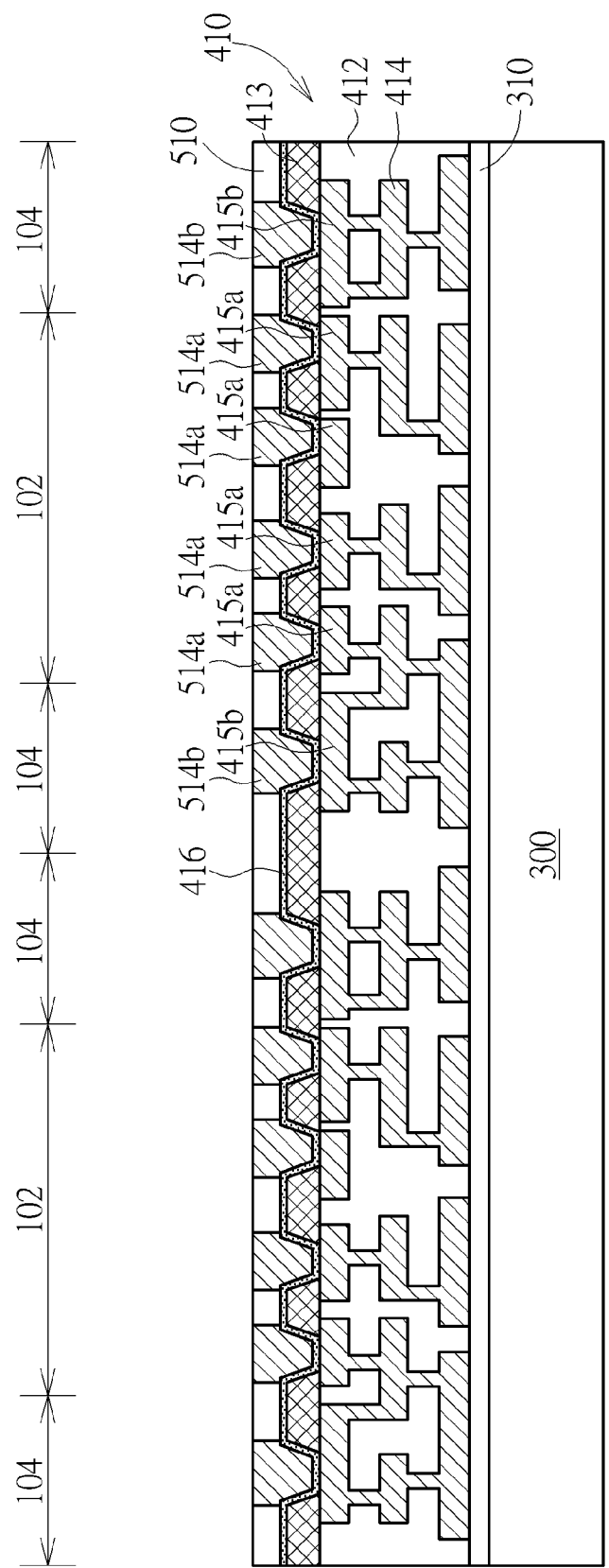

As shown in FIG. 5, a plating process is then performed to fill the openings 510a and 510b and the openings 413a and 413b with conductive studs 514a and 514b. According to the illustrated embodiment, the aforesaid plating process may comprise a copper electroplating process, but not limited thereto. The conductive studs 514a and 514b are separated from one another. According to the illustrated embodiment, the conductive studs 514a may comprise copper, aluminum, tungsten, titanium, titanium nitride, or the like. The conductive studs 514b may comprise copper, aluminum, tungsten, titanium, titanium nitride, or the like.

Figure 6:
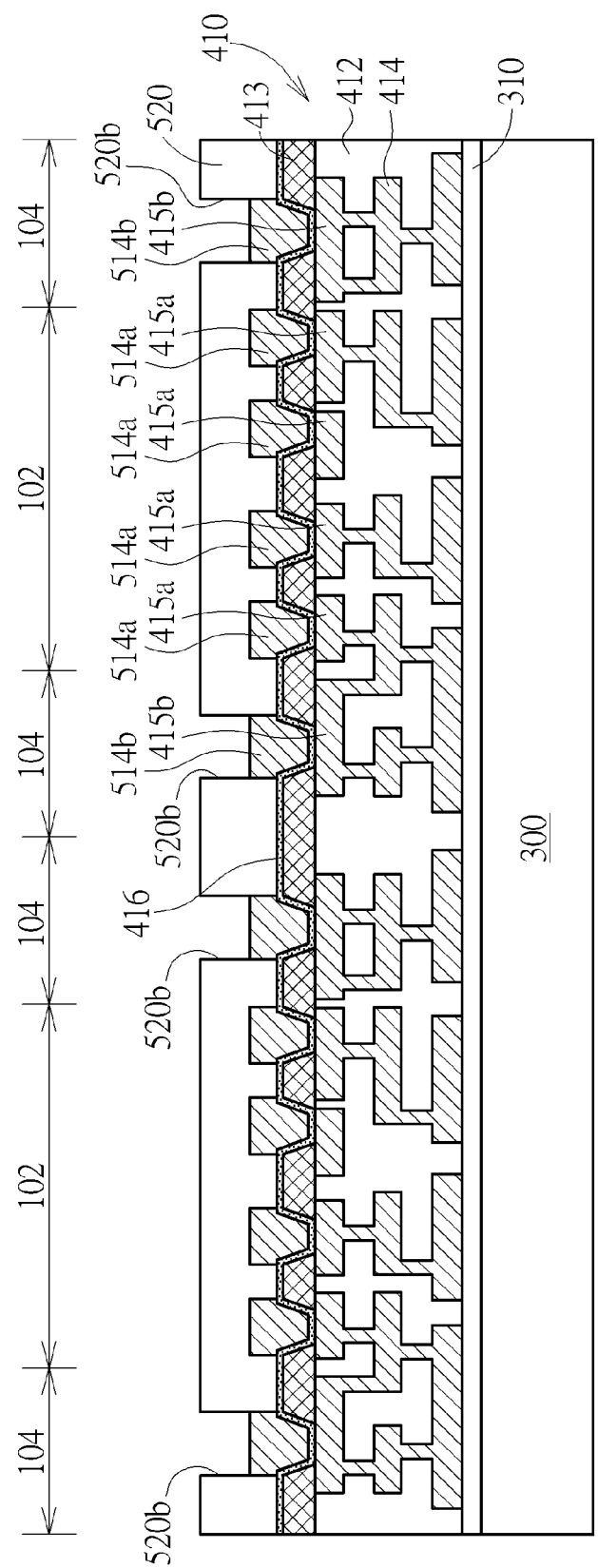

As shown in FIG. 6, another photoresist layer 520 is then coated on the photoresist layer 510 and on the conductive studs 514a and 514b. The photoresist layer 520 is patterned, for example, by using conventional lithographic processes, to thereby form a plurality of openings 520b directly above the conductive studs 514b, respectively. At this point, the conductive studs 514a are covered with the photoresist layer 510 and are not exposed.

Figure 7:
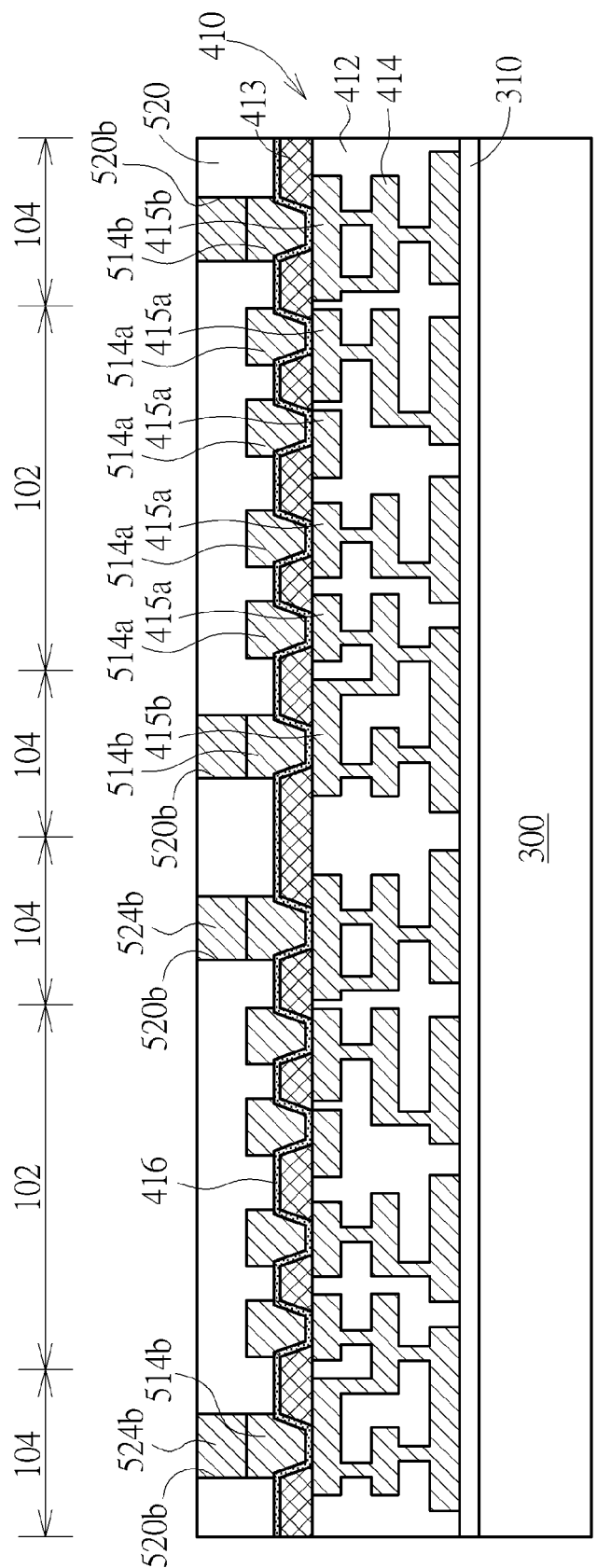

As shown in FIG. 7, another plating process is then performed to fill the openings 520b with conductive studs 524b. According to the illustrated embodiment, the aforesaid plating process may comprise a copper electroplating process, but not limited thereto. The conductive studs 524b are only formed within the openings 520b. According to the illustrated embodiment, the conductive studs 524b may comprise copper, aluminum, tungsten, titanium, titanium nitride, or the like.

Figure 8:
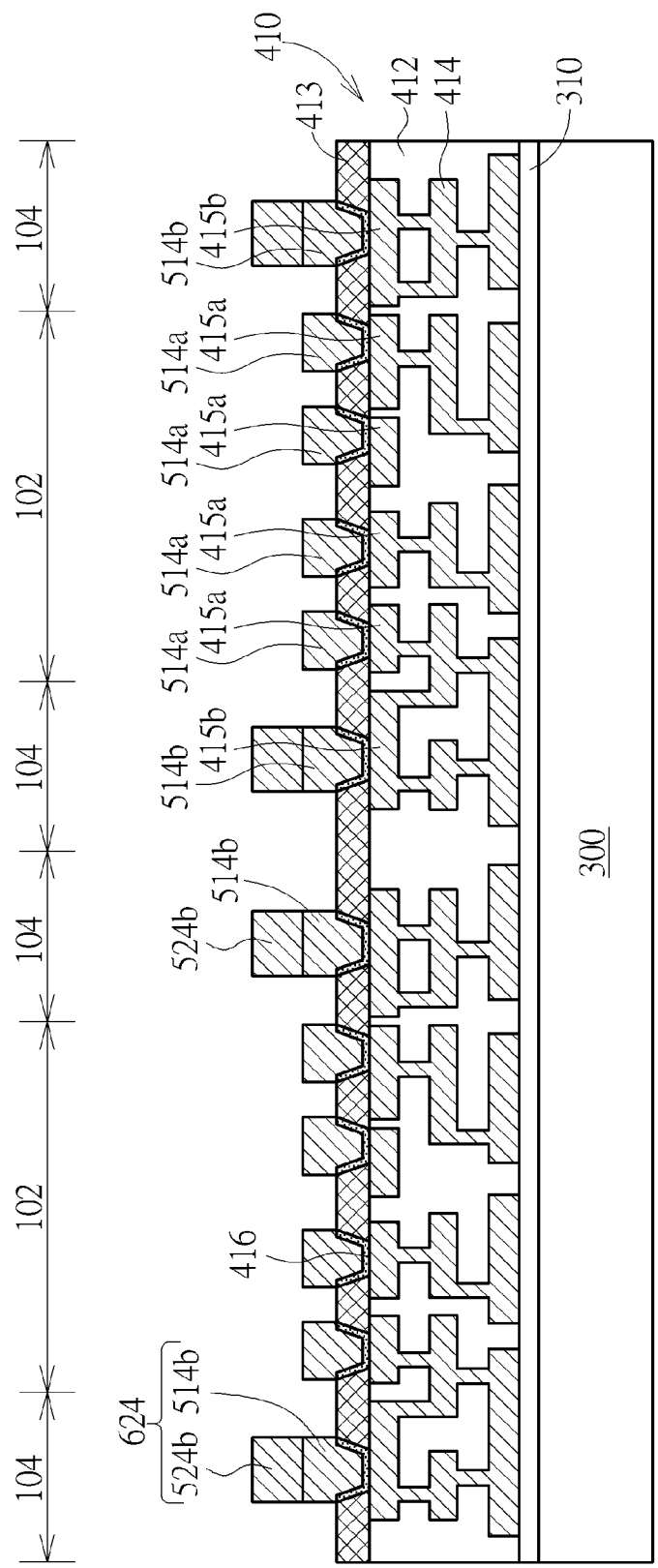

As shown in FIG. 8, the photoresist layer 520 and the photoresist layer 510 are completely removed to expose the conductive studs 514a and 514b, and the conductive studs 524b. The conductive studs 514b and 524b constitute a conductive pillar 624. Subsequently, an etching process is performed to selectively remove the conformal conductive layer 416 from the top surface of the passivation layer 413. At this point, each of the conductive pillars 624 consisting of the stacked conductive studs 514b and 524b in the peripheral area 104 is higher than the conductive studs 514a in the chip mounting area 102.

Figure 9:
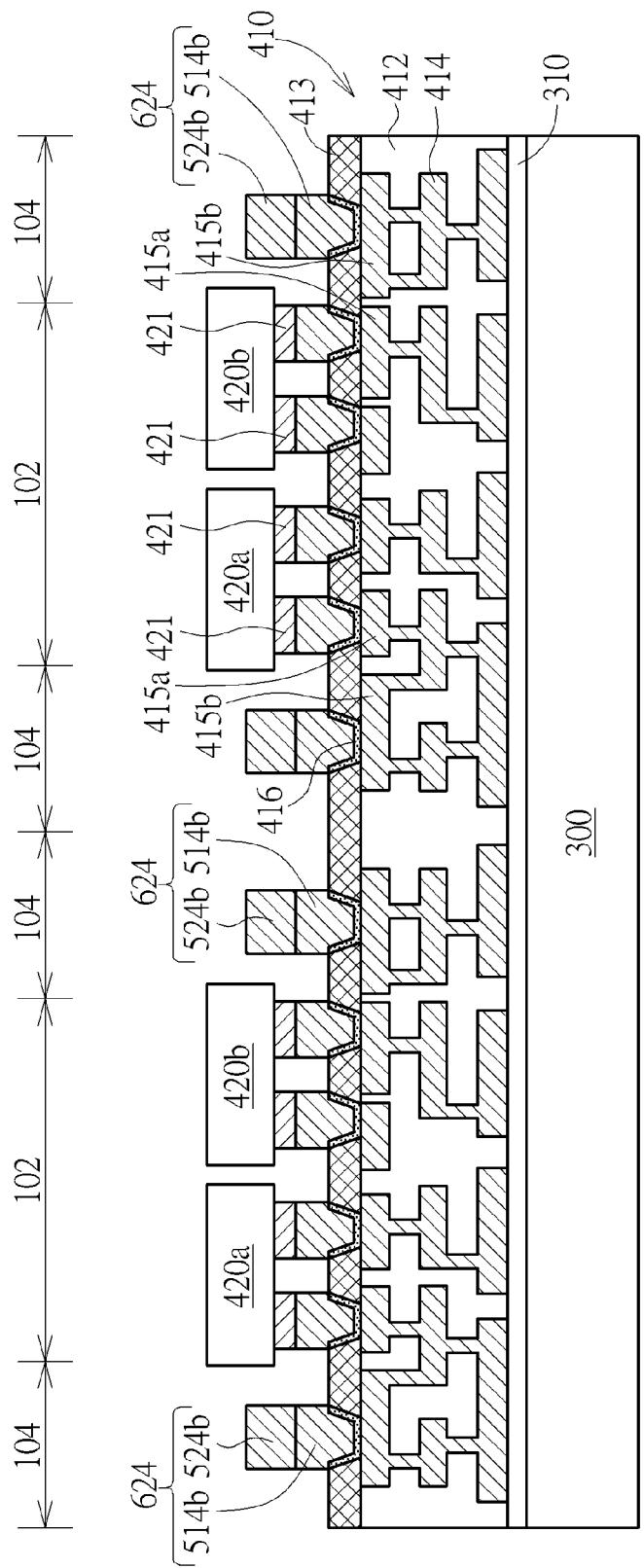

As shown in FIG. 9, subsequently, individual flip-chips or dies 420a and 420b with their active sides facing down toward the RDL 410 are then mounted on the conductive studs 514a in the chip mounting area 102 to thereby forming a stacked chip-to-wafer (C2W) construction. The dies 420a and 420b are connected to the conductive studs 514a through respective terminals 421 distributed on their flipped active surfaces. These individual flip-chips or dies 420a and 420b may be active integrated circuit chips with certain functions, for example, GPU (graphic processing unit), CPU (central processing unit), memory chips, etc.

Optionally, an underfill (not shown) may be applied under each chip 420a/420b. It is respectfully noted that the conductive pillars 624 has a top surface that is lower than the top surface of the dies 420a and 420b.

Figure 10:
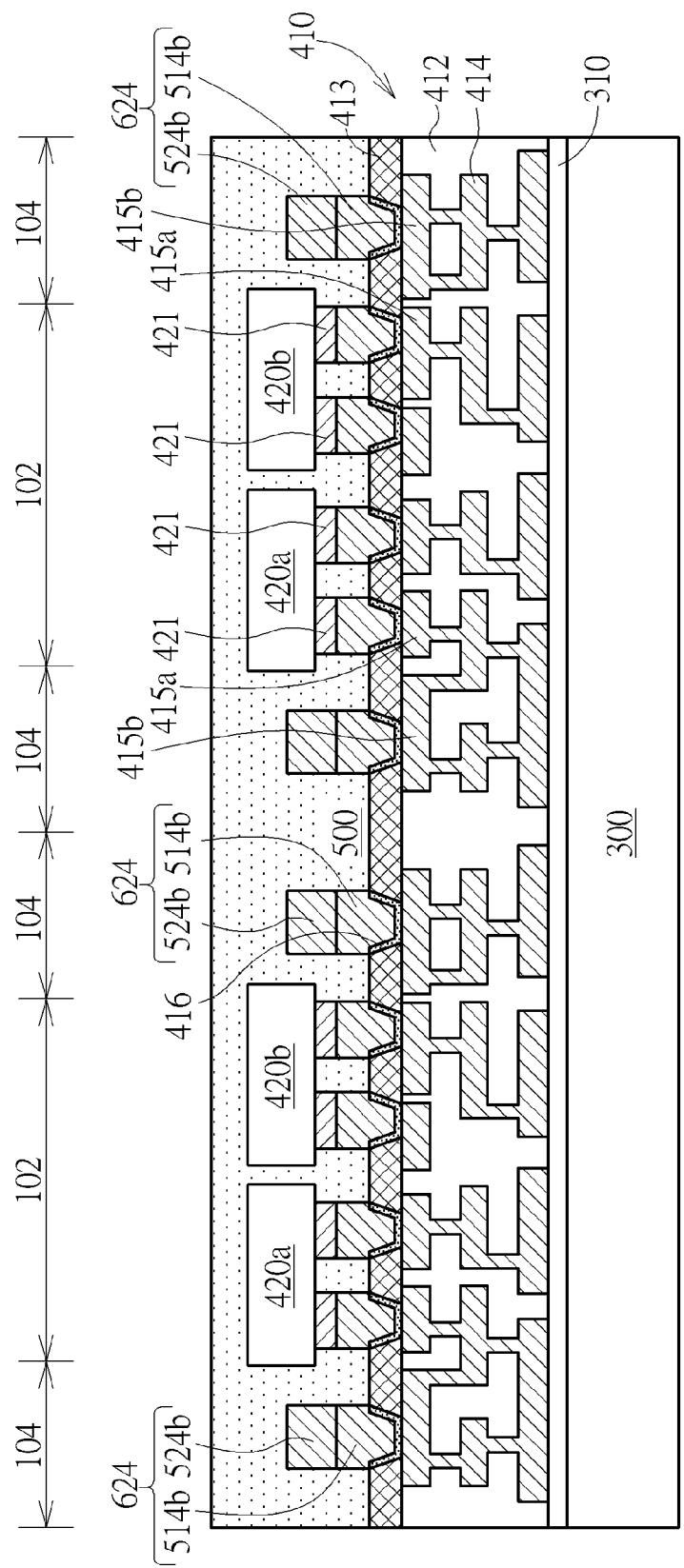

As shown in FIG. 10, after the chip-bonding process, a molding compound 500 is applied. The molding compound 500 covers the attached active chips 420a and 420b, the protruding conductive pillars 624, and the top surface of the passivation layer 413. The molding compound 500 may be subjected to a curing process. The mold compound 500 may comprise a mixture of epoxy and silica fillers, but not limited thereto.

Figure 11:
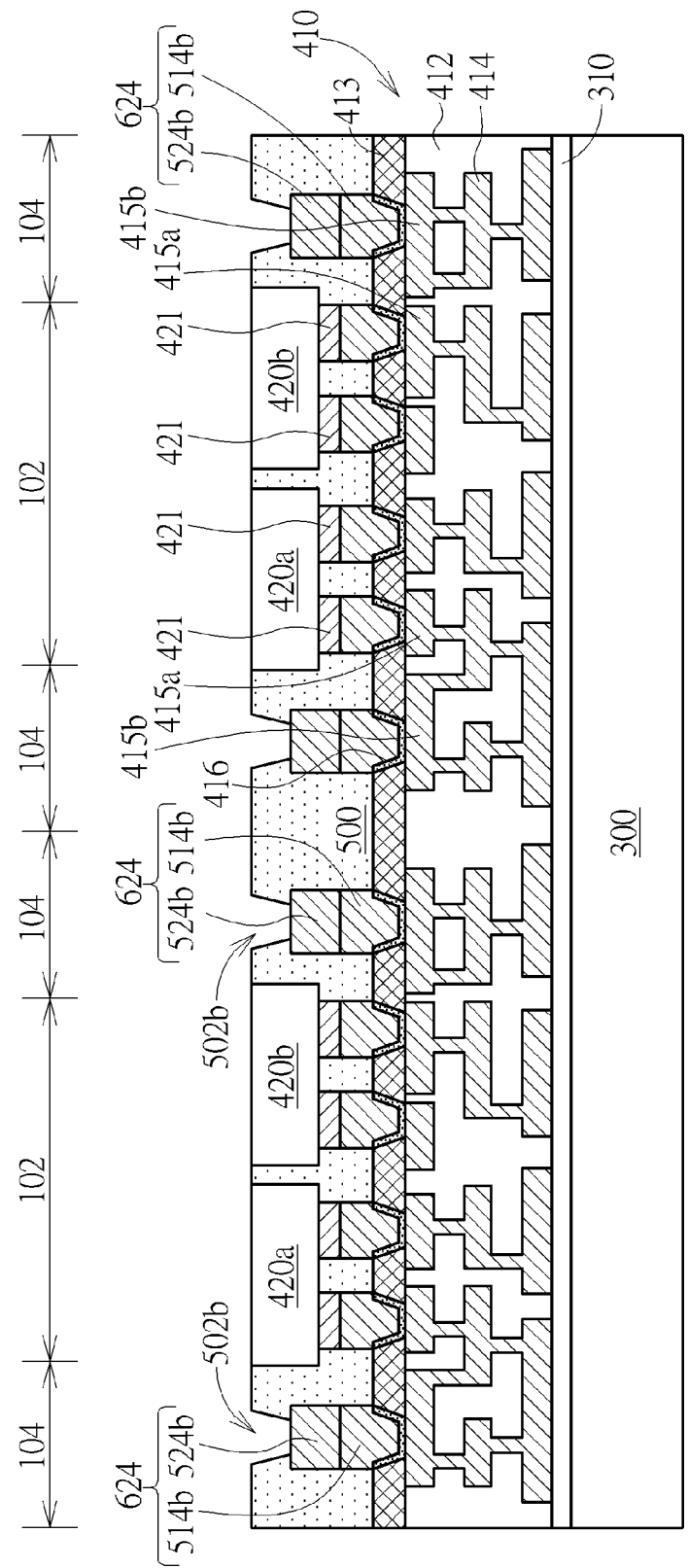

As shown in FIG. 11, optionally, the top surface of the mold compound 500 may be subjected to a grinding process to thereby remove an upper portion of the mold compound 500. At this point, the top surfaces of the active chips 420a and 420b may be flush with the top surface of the molding compound 500.

Subsequently, a laser drilling process is performed to form openings 502b in the molding compound 500, to thereby expose a top surface of each of the conductive pillars 624. It is understood that the openings 502b may be formed by other methods, such as mechanical drilling or etching. A tapered sidewall profile may be present in the openings 502b. The dimension of the opening 502b is wider at the top surface of the mold compound 500 and is narrower at the bottom near the conductive pillars 624.

Figure 12:
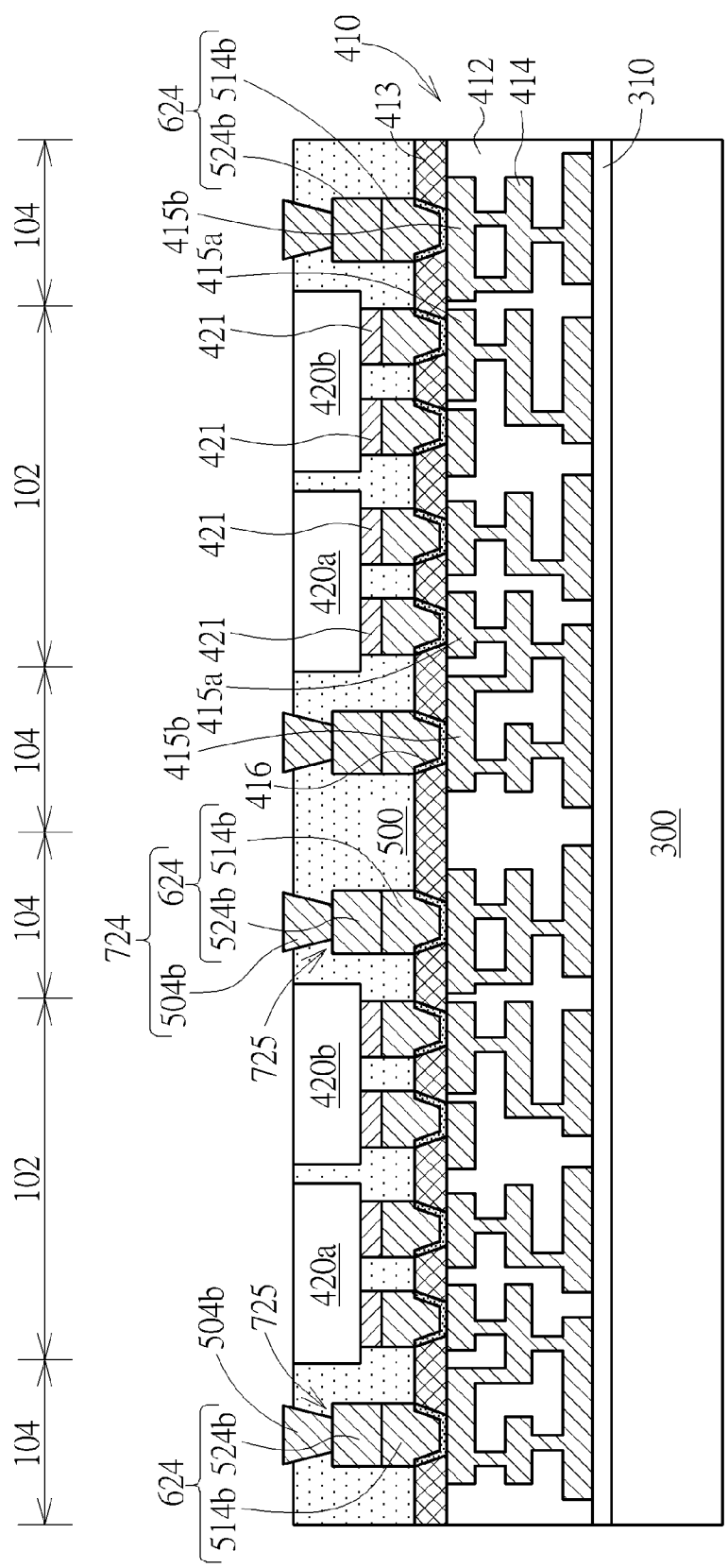

As shown in FIG. 12, another plating process is then performed to fill the openings 502b with conductive material to thereby form a partial through-mold-via (partial TMV) 504b. According to the illustrated embodiment, the aforesaid plating process may comprise a copper electroplating process, but not limited thereto. The partial TMVs 504b are only formed within the respective openings 500b. According to the illustrated embodiment, the conductive material may comprise copper, aluminum, tungsten, titanium, titanium nitride, or the like.

It is advantageous to use the present invention because the openings 502b for forming the partial TMVs has smaller aspect ratio, therefore the process window is increased and throughput and quality (yield) of the fabrication process may be improved.

According to the illustrated embodiment, the partial TMV 504b and the conductive pillar 624 constitute a peripheral bump structure 724 penetrating through the entire thickness of the mold compound 500. The partial TMV 504b has a tapered profile that conforms to the tapered profile of each of the openings 502b. Since the partial TMV 504b has a smaller width at its bottom, an undercut 725 may be formed between the partial TMV 504b and the conductive pillar 624.

Figure 13:
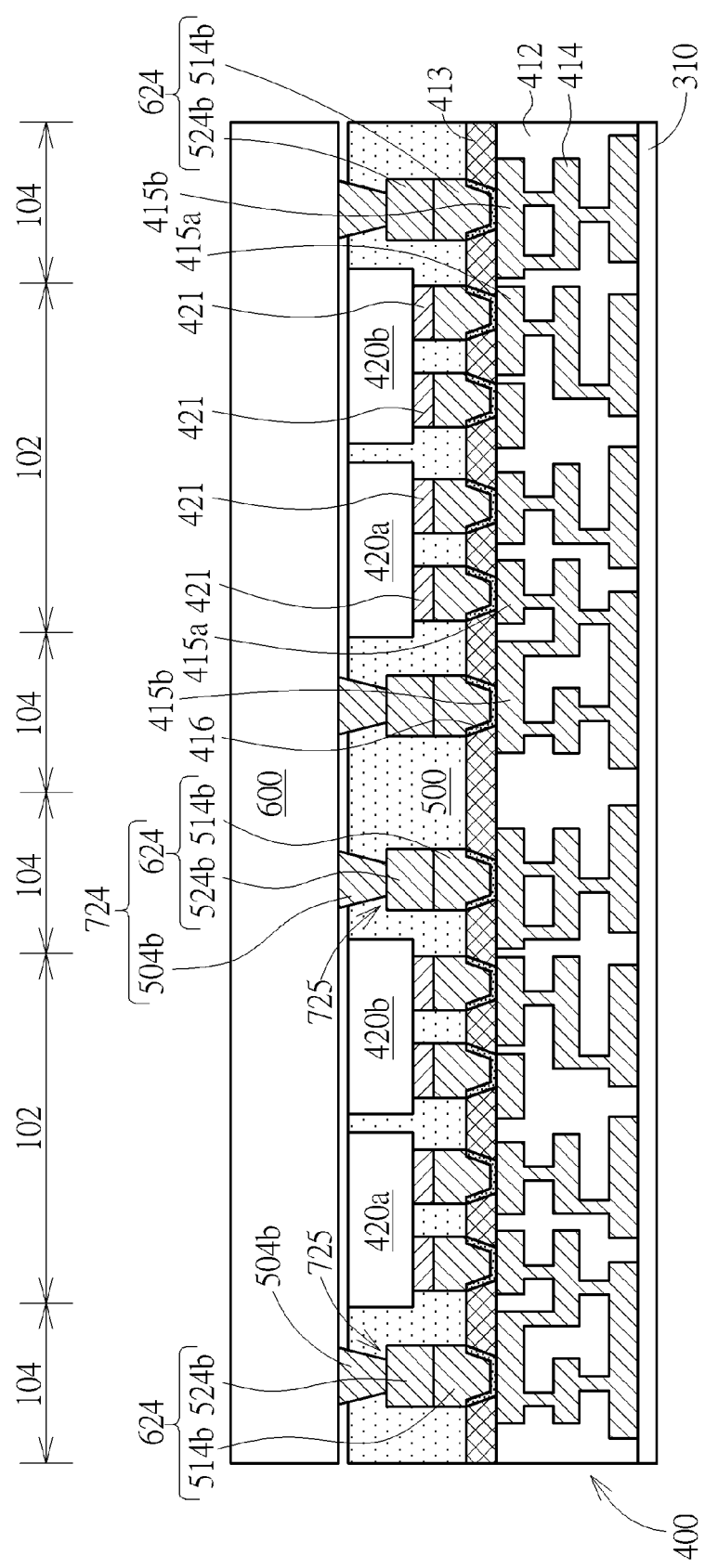

As shown in FIG. 13, subsequently, a carrier 600 is attached to the mold compound 500. The top surface of the peripheral bump structure 724 is in direct contact with the carrier 600. The carrier 600 may be a releasable substrate material with an adhesive layer (not explicitly shown), but not limited thereto. The carrier 600 provides temporary support. Thereafter, the carrier 300 is removed to thereby expose a major surface of the passivation layer 310. The RDL 410 and the passivation layer 310 may function as an interposer 400. The de-bonding of the carrier 300 may be performed by using a laser process or UV irradiation process, but not limited thereto.

Figure 14:
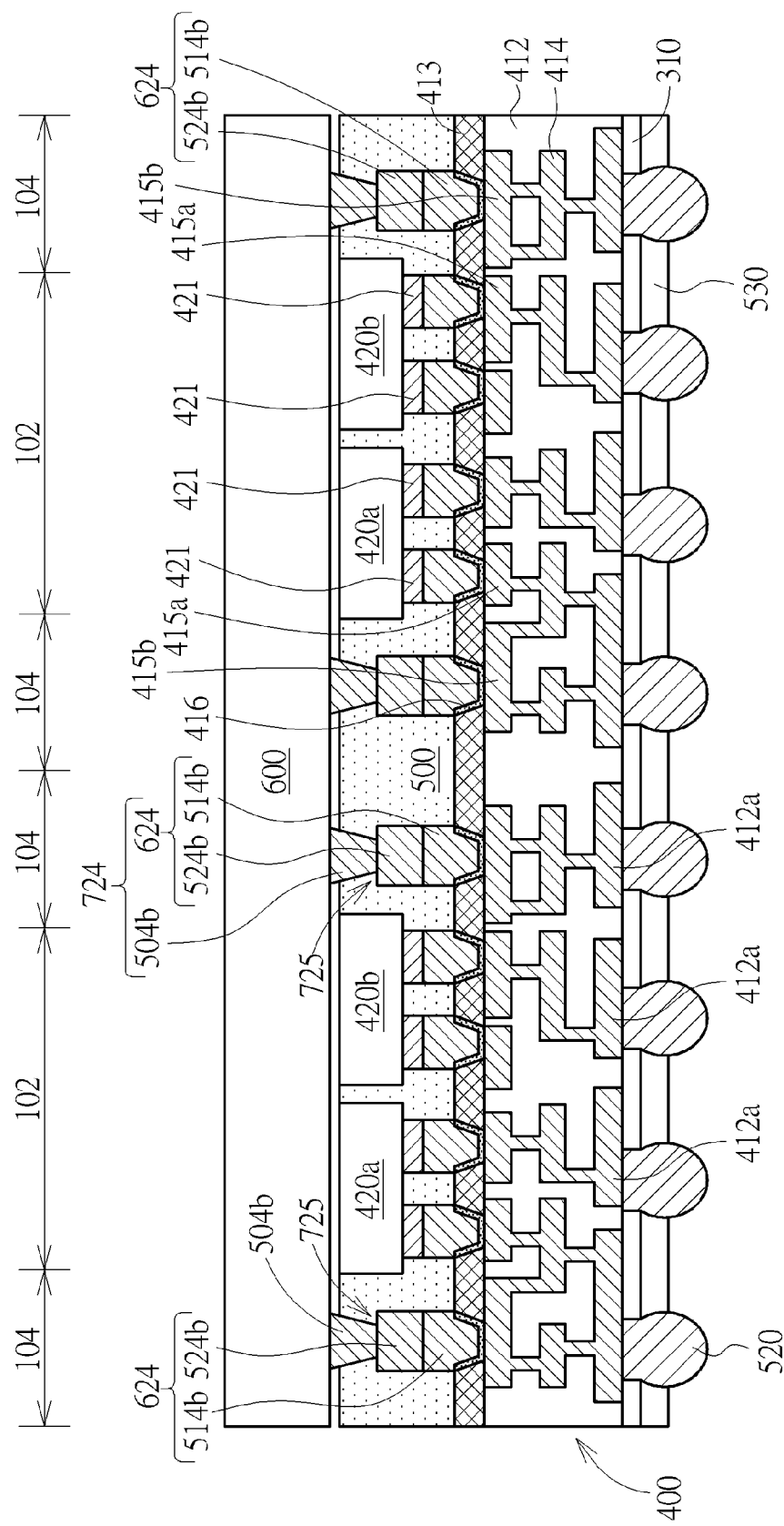

As shown in FIG. 14, after de-bonding the carrier 300, openings may be formed in the passivation layer 310 to expose respective solder pads 412a, and then solder bumps (e.g. C4) or solder balls (e.g. BGA balls) 520 may be formed on the respective solder pads 412a. Optionally, a dielectric layer or a solder mask 530 may be formed on the passivation layer 310 before forming the solder balls 520.

Figure 15:
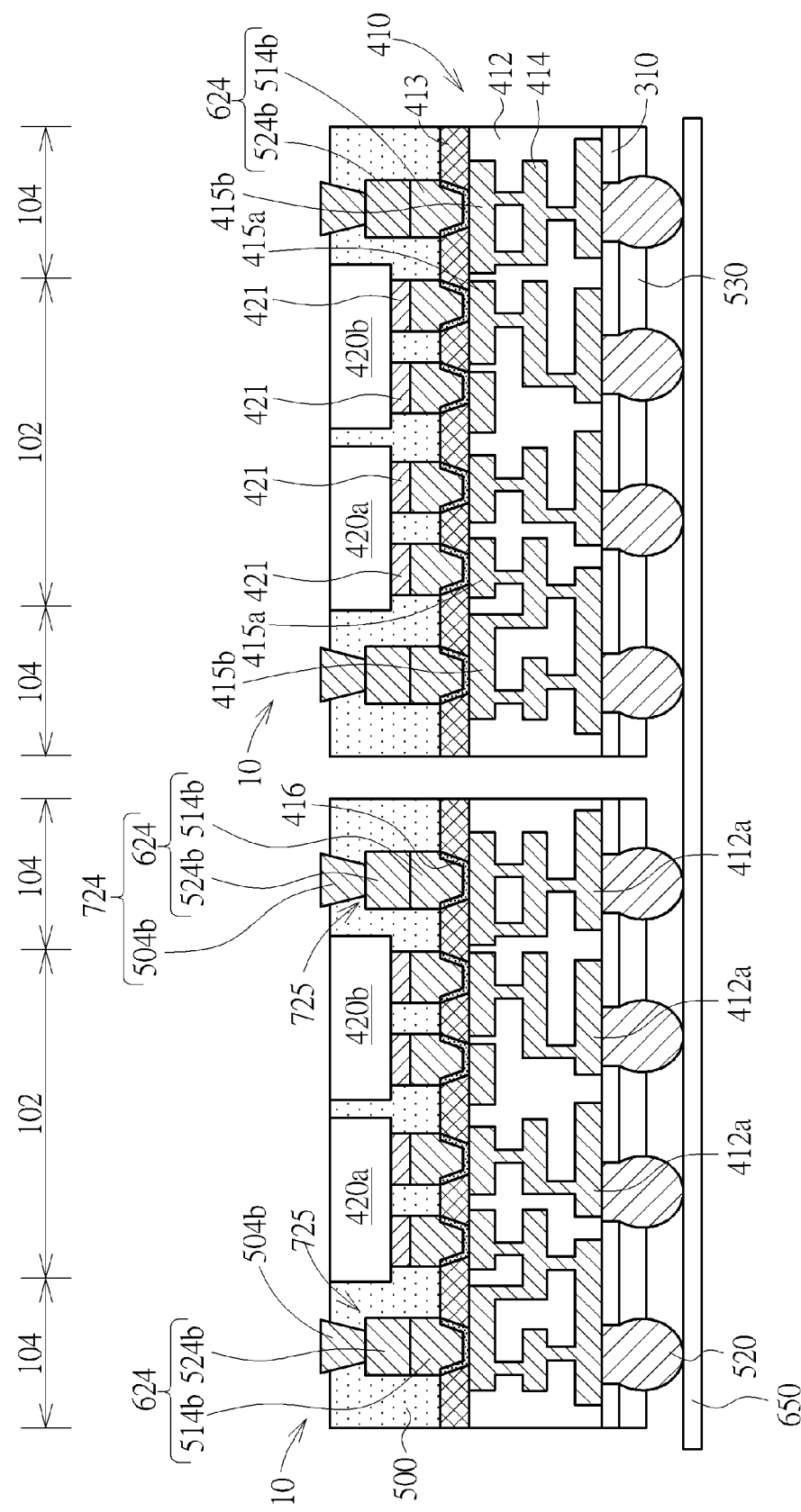

As shown in FIG. 15, subsequently, the carrier 600 is removed to expose the top surface of the peripheral bump structure 724. The wafer level package is then diced and singulated into individual die package 10. For example, before dicing, the wafer level package may be first attached to a dicing tape 650, where the bumps 520 face toward, and may contact, the dicing tape 650.

Figure 16:
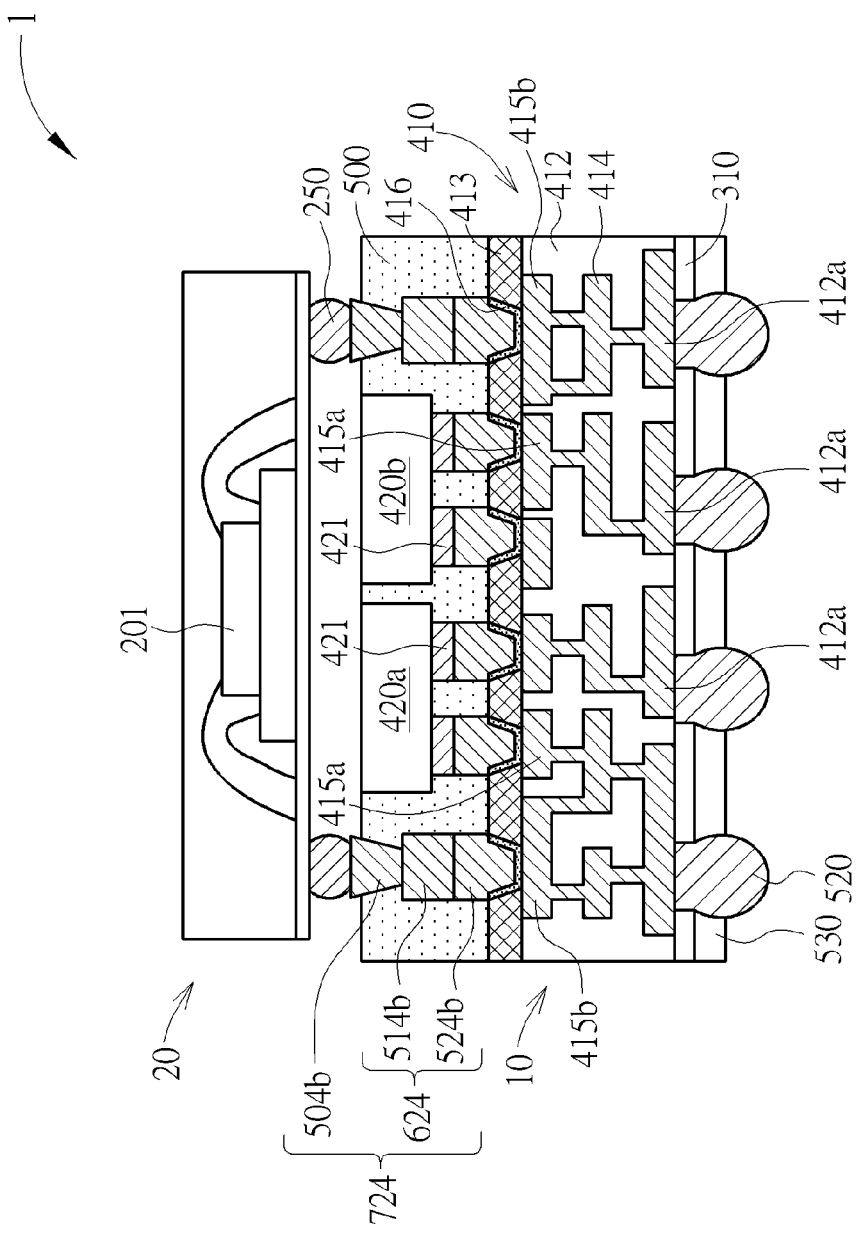

As shown in FIG. 16, a die package 20 comprising at least a molded semiconductor die 201 is mounted on the die package 10 to thereby form a PoP assembly 1. The molded semiconductor die 201 may comprise a DRAM chip, but not limited thereto. The die package 20 may comprise a plurality of BGA balls 250 aligned with the peripheral bump structure 724. The die package 20 may be electrically connected to the die package 10 through the peripheral bump structure 724 and the RDL 410.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package-on-package (PoP) assembly, comprising:
   a bottom die package comprising:
      an interposer having a first side and a second side opposite to the first side;
      at least one chip mounted on the first side within a chip mounting area through a plurality of bumps;
      a molding compound disposed on the first side, the molding compound being adjacent to the at least one chip;
      a plurality of peripheral bump structures penetrating through the molding compound within the peripheral area, wherein each of the peripheral bump structures comprises a conductive pillar embedded in the molding compound and a partial through-mold-via (partial TMV) directly stacked on the conductive pillar, wherein the conductive pillar comprises a first conductive stud and a second conductive stud stacked on the first conductive stud; and
      a plurality of solder balls mounted on the second side;
   a top die package mounted on the bottom die package and connected to the peripheral bump structures.

2. The PoP assembly according to claim 1, wherein the interposer comprises a redistribution layer (RDL).

3. The PoP assembly according to claim 2, wherein the RDL comprises at least one dielectric layer and at least one metal layer.

4. The PoP assembly according to claim 1, wherein the top die package comprises at least a molded semiconductor die.

5. The PoP assembly according to claim 1, wherein a top surface of the conductive pillar is higher than that of the bumps.

6. The PoP assembly according to claim 1, wherein an undercut is present between the conductive pillar and the partial TMV.

7. The PoP assembly according to claim 1, wherein the first conductive stud comprises copper, aluminum, tungsten, titanium, or titanium nitride.

8. The PoP assembly according to claim 7, wherein the second conductive stud comprises copper, aluminum, tungsten, titanium, or titanium nitride.

9. The PoP assembly according to claim 1, wherein the partial TMV comprises copper, aluminum, tungsten, titanium, or titanium nitride.

* * * * *